(12) United States Patent
Johnson

(10) Patent No.: US 10,823,975 B2
(45) Date of Patent: Nov. 3, 2020

(54) METHODS AND APPARATUS FOR A POLARIZING IMAGE SENSOR

(71) Applicant: SEMICONDUCTOR COMPONENTS INDUSTRIES, LLC, Phoenix, AZ (US)

(72) Inventor: Richard Scott Johnson, Boise, ID (US)

(73) Assignee: SEMICONDUCTOR COMPONENTS INDUSTRIES, Phoenix, AZ (US)

( * ) Notice: Subject to any disclaimer, the term of this patent is extended or adjusted under 35 U.S.C. 154(b) by 93 days.

(21) Appl. No.: 15/258,212

(22) Filed: Sep. 7, 2016

(65) Prior Publication Data

US 2017/0299879 A1  Oct. 19, 2017

Related U.S. Application Data

(60) Provisional application No. 62/324,224, filed on Apr. 18, 2016.

(51) Int. Cl.
| | |
|---|---|
| *H04N 7/18* | (2006.01) |
| *G02B 27/28* | (2006.01) |
| *H04N 9/04* | (2006.01) |
| *G02B 5/30* | (2006.01) |
| *G02B 3/00* | (2006.01) |
| *H01L 27/146* | (2006.01) |
| *G06K 9/00* | (2006.01) |
| *G02B 5/20* | (2006.01) |
| *G06K 9/20* | (2006.01) |

(52) U.S. Cl.
CPC ......... *G02B 27/281* (2013.01); *G02B 3/0006* (2013.01); *G02B 5/3058* (2013.01); *H01L 27/1462* (2013.01); *H04N 9/045* (2013.01); *H04N 9/0455* (2018.08); *G02B 5/201* (2013.01); *G06K 9/00791* (2013.01); *G06K 9/20* (2013.01); *H01L 27/14627* (2013.01)

(58) Field of Classification Search
CPC .... G01J 4/04; G01J 3/28; G01J 3/0229; G01J 3/447; G01J 3/453; G01J 9/0246; G01J 3/02; G01J 3/0208; G01J 3/2823; G01J 3/36; G01J 4/00; G02B 5/04; G02B 2006/12085; G02B 5/008
USPC ....................................................... 348/148
See application file for complete search history.

(56) References Cited

U.S. PATENT DOCUMENTS

| | | |
|---|---|---|
| 5,335,099 A | 8/1994 | Smith |
| 8,508,646 B2 | 8/2013 | Katerberg |
| 2009/0097117 A1 | 4/2009 | Coleman |
| 2010/0091236 A1 | 4/2010 | Matera |
| 2011/0180893 A1 * | 7/2011 | Minegishi ......... H01L 27/14618 257/432 |

(Continued)

FOREIGN PATENT DOCUMENTS

JP          2015025771 A  *  2/2015

*Primary Examiner* — Masum Billah
(74) *Attorney, Agent, or Firm* — The Noblitt Group, PLLC; Hettie L. Haines

(57) ABSTRACT

Various embodiments of the present technology may comprise a method and apparatus for a polarizing filter. The polarizing filter may be formed such that the filter has varying polarization axes for blocking reflected light emitted from various directions. The method and apparatus may utilize metal wires or molecular chains to form curved lines across the filter, where the curved lines define the polarization axes.

20 Claims, 6 Drawing Sheets

(56) References Cited

U.S. PATENT DOCUMENTS

2014/0321709 A1* 10/2014 Kasahara .............. B60S 1/0844
                                                        382/103
2015/0219813 A1*  8/2015 Blacker ................ G02B 5/3058
                                                      351/159.56

* cited by examiner

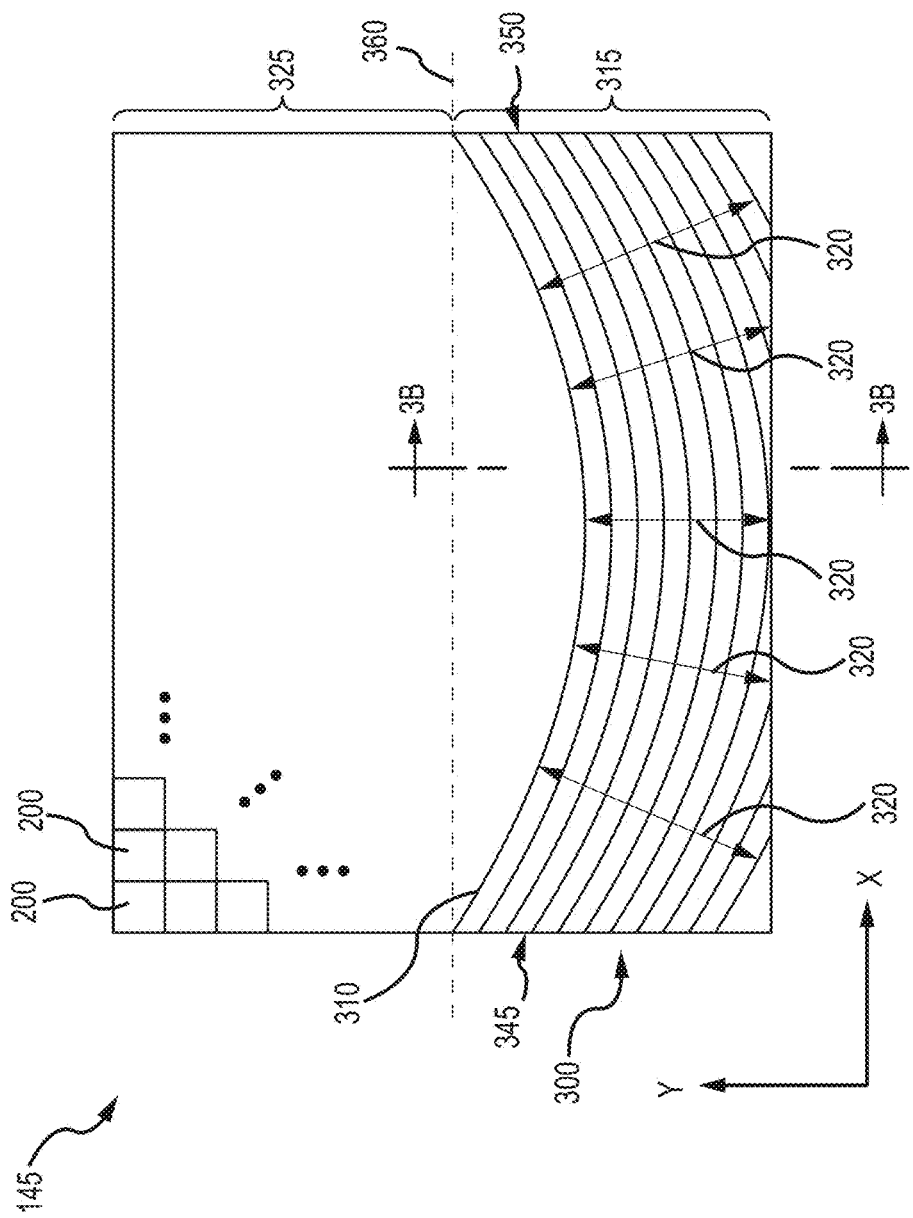

METHODS AND APPARATUS FOR A POLARIZING IMAGE SENSOR

CROSS-REFERENCE TO RELATED APPLICATION

This application claims the benefit of U.S. Provisional Patent Application Ser. No. 62/324,224, filed on Apr. 18, 2016, and incorporates the disclosure of the application in its entirety by reference. To the extent that the present disclosure conflicts with any referenced application, however, the present disclosure is to be given priority.

BACKGROUND OF THE TECHNOLOGY

Advanced Driver Assistance Systems (ADAS), surveillance systems, and the like, utilize cameras to capture and interpret images. Accurate interpretation of these images directly affects the performance of the overall system. Due to the properties of light, in some conditions, reflected light may cause glare. For example, reflections from a dashboard (or other surface) onto a windshield (or other reflective surface) may cause glare and corrupt the input content of an imaging device, such as a camera, used in the ADAS, surveillance systems, and the like.

A cabin of a vehicle may contain a camera, used in an ADAS, placed near the top of the windshield or within the rearview mirror. Due to the location and angle of the camera, the glare due to reflected light may appear warped, for example as shown in FIG. 6. The glare may also comprise "ghost images," for example as shown in FIG. 6, caused by contrast differences on the dashboard, such as shapes and features of split lines, defroster grills, labels, and the like. ADASs may have difficulty properly interpreting the reflections of light, which may lead to system malfunction. The reflected light causing the glare may comprise polarized or partially polarized light.

When light is traveling in a particular direction, it has an electric field vector and a magnetic field vector. These field vectors are perpendicular to each other and to the direction of propagation. Most light sources, such as the sun, produce unpolarized light. Light may become polarized or partially polarized by reflection. Reflected light has an electric field vector with a fixed orientation or azimuthal angle. A polarizing filter blocks or absorbs polarized and/or partially polarized light.

The amount of light incident on a polarizing filter that passes through the filter depends on the angle between the electric field vector of the light and the polarization axis of the filter. For a polarizing filter to suppress the light polarized by a reflection off a surface, the polarizing filter must be oriented so that its polarization axis is perpendicular to the electric field vector of the reflected light. The filter blocks any field vectors that are perpendicular to the polarization axis and those which are parallel to the polarization axis pass through the filter.

Conventional polarizers use a pattern of parallel straight lines, which are oriented horizontally or vertically, to block and/or attenuate light. Such polarizers, when used in conjunction with the camera in the ADAS, may only block a portion of the reflected light since the angle of the reflected light varies with the curvature and pitch of the windshield, angle and reflective properties of the dashboard, and the like.

SUMMARY OF THE INVENTION

Various embodiments of the present technology may comprise a method and apparatus for a polarizing filter. The polarizing filter may be formed such that the filter has varying polarization axes for blocking reflected light emitted from various directions. The method and apparatus may utilize metal wires or molecular chains to form curved lines across the filter, where the curved lines define the polarization axes.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates an imaging system in accordance with an exemplary embodiment of the present technology;

Figure 5:
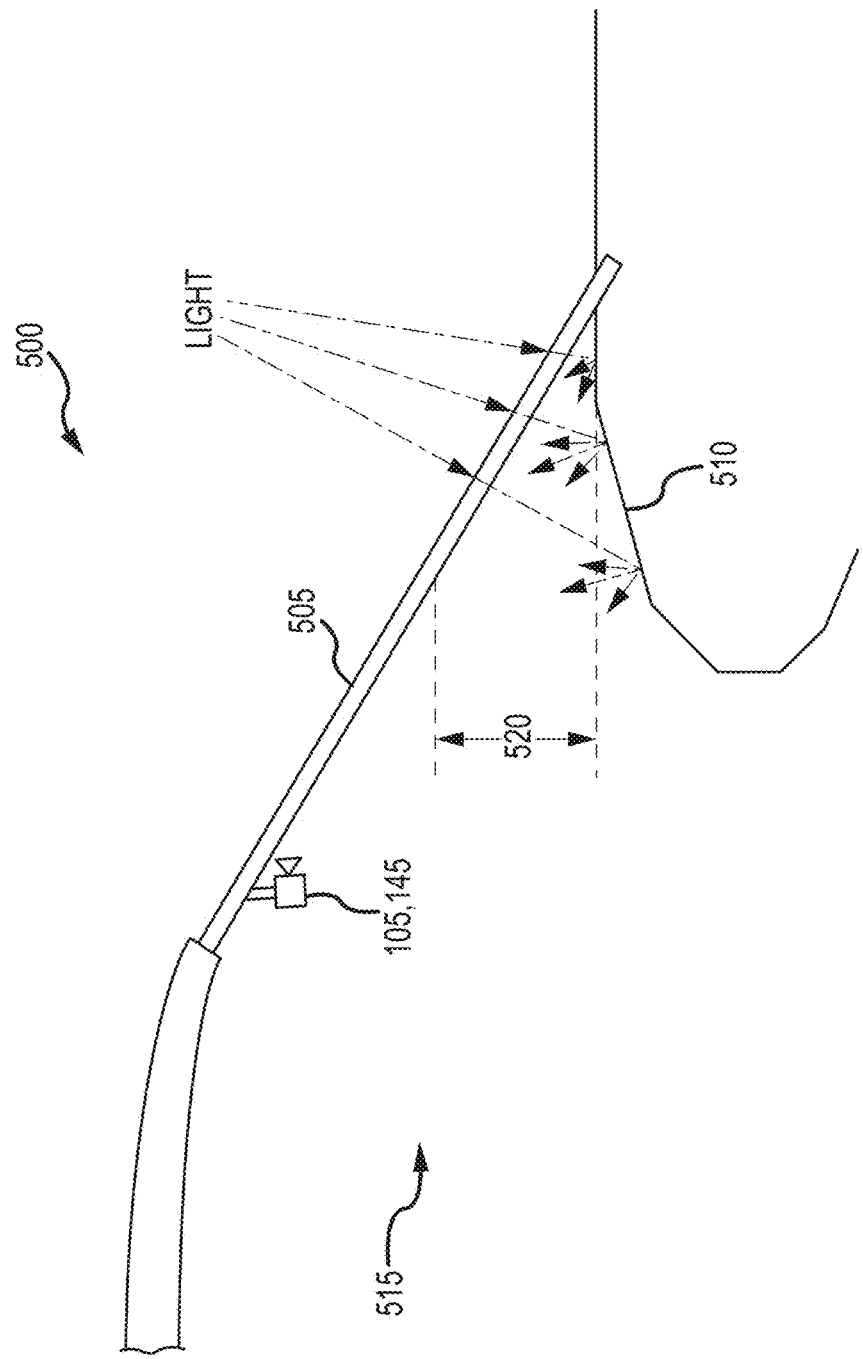

FIG. 5 representatively illustrates reflected light in a vehicle; and

Figure 6:
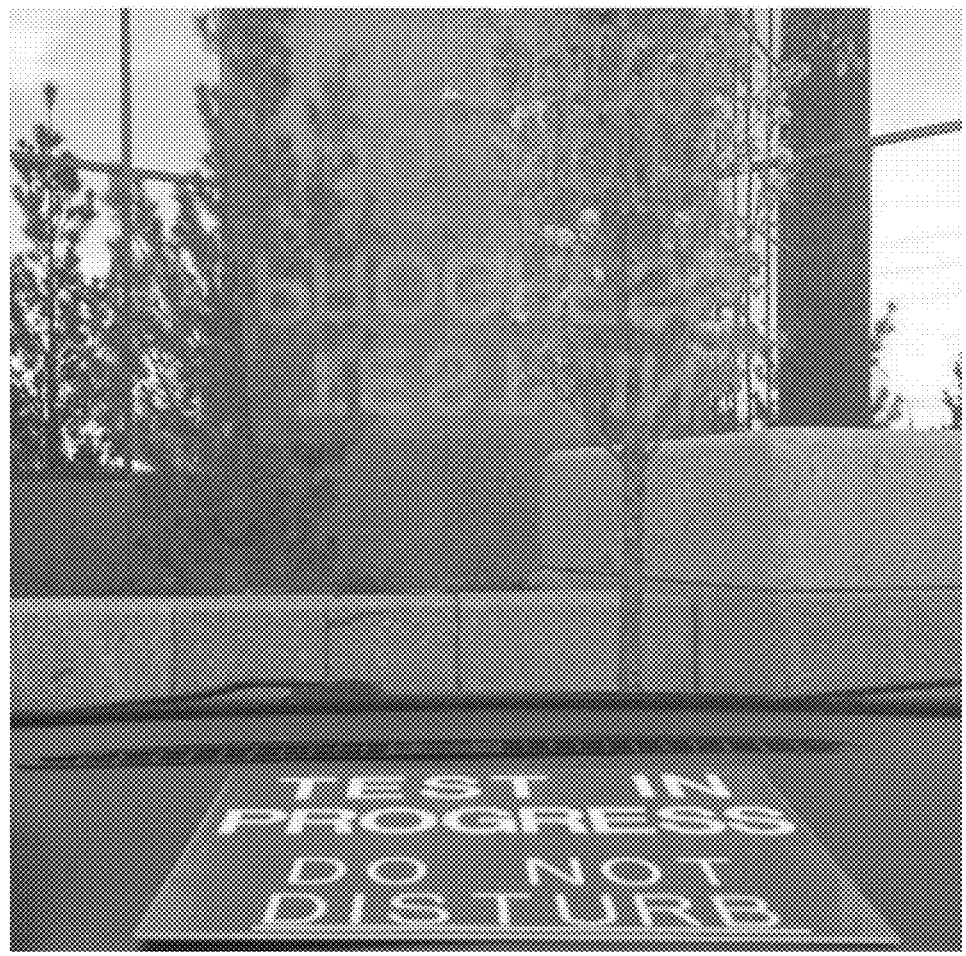

FIG. 6 representatively illustrates glare captured by an imaging system from within a vehicle cabin.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various types of polarizers, imagers, cameras, sensors, and the like, which may carry out a variety of functions. In addition, the present technology may be practiced in conjunction with any number of applications, and the apparatus described is merely one exemplary application for the technology. Further, the present technology may employ any number of conventional techniques for processing and manufacturing polarization grids, polarization films and the like, and may employ any number of materials.

Methods and apparatus according to various aspects of the present technology may be used in conjunction with any suitable imaging system, such as a camera system, video system, machine vision, vehicle navigation, surveillance system, motion detection system, image stabilization system, and the like. Various representative implementations of the present technology may be applied, for example, to any image sensor, imaging device, pixel array, and the like.

Figure 1:
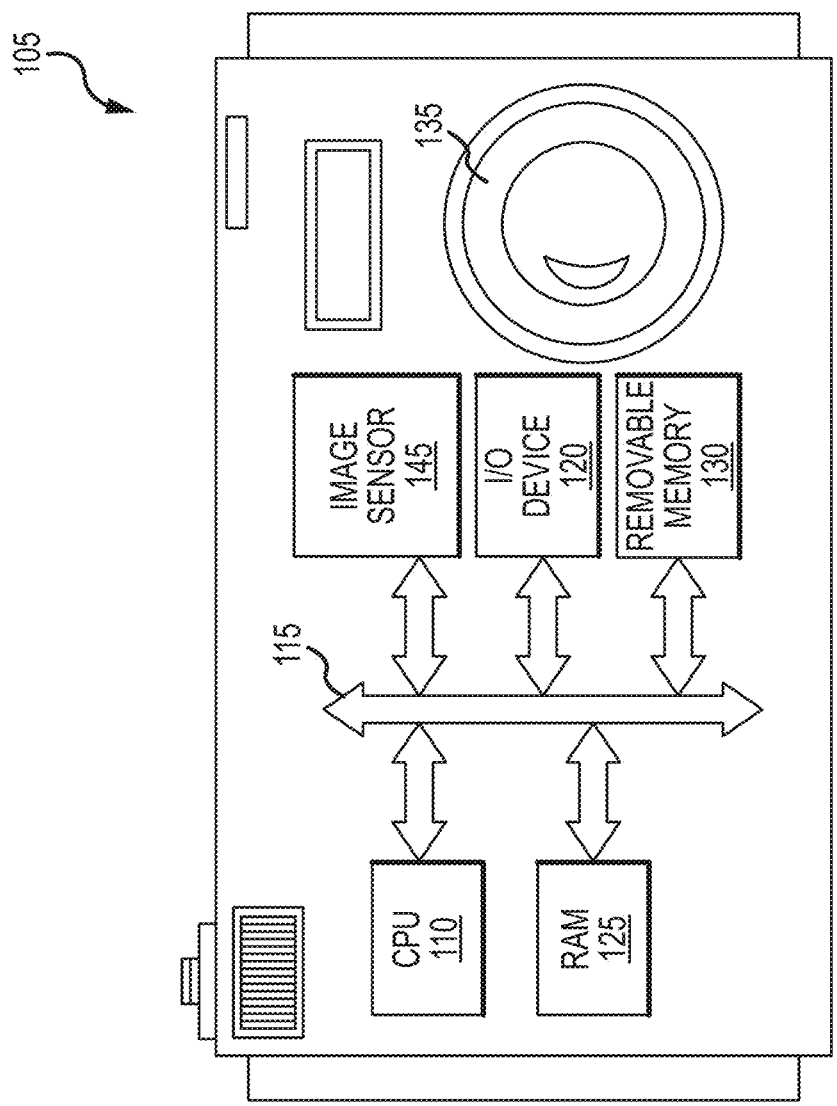

Referring to FIG. 1, the imaging system may comprise an electronic device, such as a camera 105. The imaging system may comprise a central processing unit (CPU) 110 that communicates with various devices over a bus 115.

Figure 2:
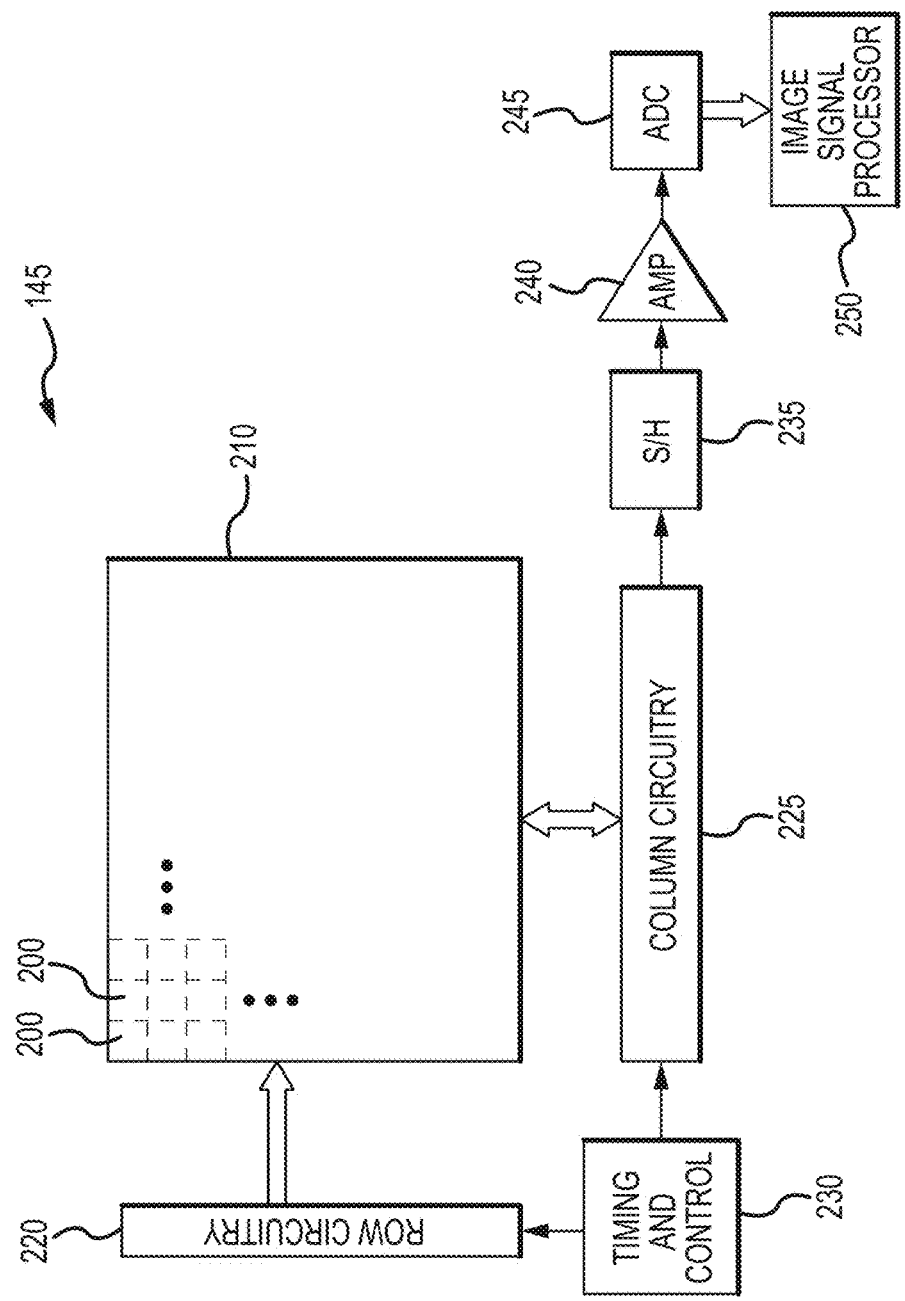
FIG. 2 is a block diagram of an image sensor in accordance with an exemplary embodiment of the present technology FIG. 3A representatively illustrates a polarizing image sensor in accordance with an exemplary embodiment of the present technology.

An input/output (I/O) device 120 may be connected to the bus 115 and may provide communication into and out of the imaging system. The I/O device 120 may comprise an external device, such as a computer display, memory card, or some other external unit. The I/O device 120 may receive digital image data, such as video data, image data, frame data, and/or gain information from an image signal processor 250 (FIG. 2). In other embodiments, the I/O device 120 may comprise an internal device, such as a display screen or a memory component, for directly viewing and/or storing the digital image data.

Other devices connected to the bus 115 provide memory, for example, a random access memory (RAM) 125, hard drive, and one or more peripheral memory devices 130, such as a floppy disk drive, compact disk (CD) drive, USB drives, memory cards, and SD cards. While the bus 115 is illustrated as a single bus, any number of busses may be used to provide communication paths to interconnect the devices.

The imaging system may further comprise an image sensor 145 for capturing and processing image data. For example, light may enter the camera 105 through a lens 135 and strike the image sensor 145. The image sensor 145 may detect and convey the information that constitutes an image, for example by converting the variable attenuation of waves (as they pass through or reflect off objects) into electronic signals. The image sensor 145 may be implemented in conjunction with any appropriate technology, such as using semiconductor charge-coupled devices (CCD), active pixel sensors in complementary metal-oxide-semiconductors (CMOS), analog sensors, and/or flat panel detectors.

In various embodiments, the image sensor utilizes the lens 135 to focus an image on a pixel array 210 (FIG. 2). The lens 135 may include a fixed and/or adjustable lens configured to adjust the image being focused.

Referring to FIG. 5, in an exemplary embodiment, the imaging system may be located within a cabin 515 of a vehicle 500 and used in conjunction with an ADAS. For example, the camera 105 may be located near or within a rearview mirror (not shown) and positioned to capture images through a windshield 505.

Referring to FIG. 2, in an exemplary embodiment of the present technology, the image sensor 145 may comprise a plurality of pixels 200 arranged in rows and columns to form the pixel array 210. The pixels 200 may be electrically connected via metal wirings or other suitable connections. The pixel array 210 may be formed in silicon using any suitable CMOS technology and/or fabrication process.

In various embodiments, each pixel 200 may comprise a photosensitive element for converting light into an electric charge, for example, the pixel 200 may comprise a photodiode, a photogate, or any other semiconductor device responsive to light. In various embodiments, the pixel 200 may comprise a pinned photodiode capable of being fully depleted at a depletion voltage.

In various embodiments, the image sensor 145 may further comprise row circuitry 220, column circuitry 225, and a timing and control unit 230, to selectively activate sequential rows of pixels and to read out the pixel signals to a sample-and-hold circuit 235. The pixel signals may be then be transmitted to an amplifier 240 to amplify the signals prior to being converted to digital signals by an analog to digital converter 245. Each pixel signal may comprise image data, such as scene illuminance, and row and column identifiers. The digital pixel signals may then be transmitted and stored in the image signal processor 250 for further processing.

The image signal processor 250 may comprise any number of semiconductor devices, such as transistors, capacitors, and the like, for performing calculations, transmitting and receiving image data, and a storage unit for storing image data. In various embodiments, the image signal processor 250 may be implemented with a programmable logic device, such as a field programmable gate array (FPGA) or any other device with reconfigurable digital circuits. In other embodiments, the image signal processor 250 may be implemented in hardware using non-programmable devices. In alternative embodiments, the image signal processor 250 may be formed partially or entirely within an integrated circuit (IC) in silicon using any suitable CMOS techniques or fabrication processes, in an application-specific integrated circuit (ASIC), using a processor and memory system, or other suitable implementation. In various embodiments, the image signal processor 250 may be formed on the same IC as the pixel array 210. In alternative embodiments, the image signal processor 250 may be formed on a companion chip, separate from the pixel array 210.

Figure 3B:
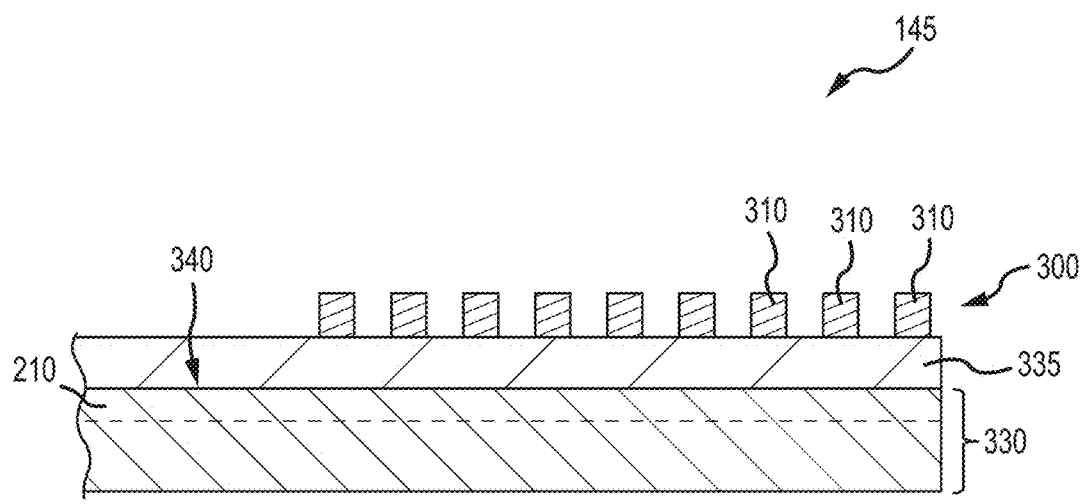
FIG. 3B is a cross-sectional view of the polarizing image sensor illustrated in FIG. 3A.

Referring to FIGS. 3A-3B, the image sensor 145 may comprise a polarizing filter 300 for blocking and/or attenuating polarized light. In various embodiments, the polarizing filter 300 may comprise a plurality of ridge structures 310. The ridge structures 310 may comprise any suitable device or system for limiting the light allowed to pass into the image sensor 145. For example, the ridge structures 310 may comprise closely spaced, continuous fine metal wires. In various embodiments, the ridge structures 310 may be positioned or spaced substantially equidistant from one another.

The ridge structures 310 may be formed using any suitable method or process, such as etching, photolithography, nanoimprint fabrication, molds, and any combination thereof. In various embodiments, the ridge structures 310 may be fabricated using aluminum, tungsten, silver, copper, gold, or any combination of layers of such materials.

In various embodiments, the ridge structures 310 may be positioned adjacent to a major surface 340 of a substrate 330, where the pixel array 210 is formed therein. In various embodiments, the ridge structures 310 may be disposed directly on the major surface 340 of the substrate 330. In alternative embodiments, an insulating layer 335, for example an oxide layer 335, such as $SiO_2$, may be disposed between the polarizing filter 300 and the substrate 330.

Figure 4:
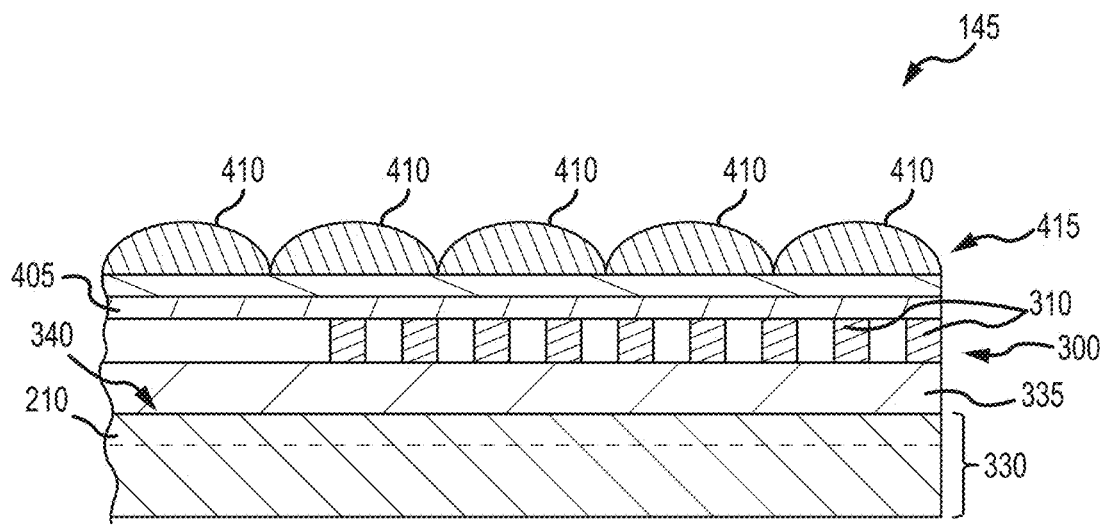
FIG. 4 is a cross-sectional view of a polarizing image sensor in accordance with an exemplary embodiment of the present technology.

Referring to FIG. 4, according to various embodiments, the image sensor 145 may further comprise a color filter system, such as a color filter array (CFA) 405 comprising a pattern of color filters. The CFA 405 may be positioned adjacent to the major surface 340 of the substrate 330 to capture color information. In the exemplary embodiment, each photosensitive element is covered with one color of the CFA 405. For example, the CFA 405 may comprise a "Bayer" color filter array comprising a pattern of red R, blue B, and green G filters. In other embodiments, the CFA 405 may be formed using other color filters, such as a CYYM filter (one cyan, two yellow, and one magenta), a CYGM filter (one cyan, one yellow, one green, and one magenta), a CRGB filter (one cyan, one red, one green, and one blue), and any other suitable color pattern. In various embodiments, the CFA 405 may comprise "clear" or transparent filter elements. The CFA 405 may form a 2×2 color pattern, a 4×4 color pattern, a 2×4 color pattern, or any other suitable pattern size. In various embodiments, the CFA 405 may repeat to cover the entire pixel array 105.

In an exemplary embodiment, the CFA 405 may be positioned adjacent to the polarizing filter 300, wherein the polarizing filter 300 is positioned between the CFA 405 and the pixel array 210. In alternative embodiments, however, the CFA 405 may be positioned between the pixel array 210 and the polarizing filter 300.

According to various embodiments, the image sensor 145 may further comprise a microlens array 415 to increase light collection efficiency. The microlens array 415 may comprise a plurality of microlenses 410. Each microlens 410 may help focus light on the photosensitive region of the pixel 200 (FIG. 2). The size and type of microlens 410 may be selected for a particular application. The microlens 410 may be formed using conventional fabrication techniques and methods. In an exemplary embodiment, the microlens array 415 may be disposed adjacent to the polarizing filter 300, wherein the polarizing filter is positioned between the microlens array 415 and the polarizing filter 300. In alternative embodiments, however, the microlens array 415 may be disposed below the polarizing filter 300. In various embodiments, the polarizing filter 300 may be disposed between the CFA 405 and the microlens array 415.

In other embodiments, the polarizing filter 300 may comprise chains of molecules (not shown) for blocking and/or attenuating polarized light and may be formed using conventional techniques, such as microscopic crystals of iodoquinine sulfate embedded in a polymer film, as described in U.S. Pat. No. 1,918,848, a polyvinyl alcohol polymer impregnated with iodine, or aligned polyvinylene chains.

Referring again to FIG. 3A, the polarizing filter 300 attenuates light that has an electric field that is parallel to the ridge structures 310. The ridge structures 310 may be oriented to create multiple polarization axes 320 along a length of the polarizing filter 300. In an exemplary embodiment, the ridge structures 310 may be arranged in a curved (i.e. non-linear) pattern to allow the polarizing filter 300 to attenuate light reflected at angles. The curved pattern may create various polarization axes 320 across the polarizing filter 300, each with a different orientation relative to a fixed location on the polarizing filter 300, such as a center line 360 of the polarizing filter 300. For example, the curved pattern may form a polarization axis 320 with a first orientation at a first portion of the polarizing filter 300, while the curved pattern may form a different polarization axis with a second orientation at a second portion of the polarizing filter 300. In general, each polarization axis 320 remains perpendicular to the curved pattern formed by the ridge structures 310 regardless of where measured along a length of the ridge structures 310.

The orientation of each polarization axis 320 may be defined by an angle from an x-axis. In various embodiments, the polarizing filter 300 may be configured such that each polarization axis 320 comprises an orientation angle of between zero and 180 degrees from the x-axis. Since the polarizing filter 300 may block or attenuate the reflected light that has an electric field vector that is perpendicular to the polarization axis 320 (i.e., parallel to the ridge structures 310), the polarizing filter 300 may block or attenuate light reflected at various angles. For example, the ridge structures 310 may form a series of arc shaped ridges protruding upwardly away from the major surface 340 and extending from a first end 345 of the pixel array 210 to a second end 350 of the pixel array 210.

The orientation of the polarization axes 320 at different areas of the polarizing filter 300 and a particular curved pattern may be selected according to a particular application. For example, the image sensor 145 may be utilized in a vehicle equipped with ADAS. As such, various factors, such as the angle and curvature of a windshield 505 (FIG. 5), the angle and curvature of a dashboard 510 (FIG. 5), and the location and orientation of the image sensor 145 in relation to the windshield 505 and dashboard 510 may be considered when defining the curved pattern and resulting polarization axes 320.

In an exemplary embodiment, the ridge structures 310, or chain of molecules, cover a portion of the polarizing filter 300, for example, the ridge structures 310 may cover an entire area, or a substantial area of a first section 315 of the pixel array 210, while a second section 325 remains free of the ridge structures 310. In various embodiments, portions of the image sensor 145, which are free of the ridge structures 310, may exhibit increased sensitivity. This configuration may also result in overall improved performance of the image sensor 145.

Referring again to FIG. 5, in the present embodiment, the polarizing filter 300 (FIG. 3) may attenuate reflected light impinging on a bottom portion 520 of the windshield 505, where glare is likely to occur. As such, the polarizing filter 300 may be affixed directly to the windshield 505.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

While the technology has been described with reference to specific exemplary embodiments, various modifications and changes may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A polarizing image sensor, comprising:
   a pixel array comprising photosensitive elements; and
   a polarizing filter positioned adjacent to a major surface of at least a portion of the pixel array, wherein the polarizing filter comprises a plurality of ridge structures, wherein each ridge structure, from the plurality of ridge structures, is arranged in an arc shape that extends in a horizontal direction from a first edge of the pixel array to an opposing second edge of the pixel array, and the plurality of ridge structures are spaced substantially equidistant from one another.

2. The polarizing image sensor of claim 1, wherein the plurality of ridge structures comprises aluminum.

3. The polarizing image sensor of claim 1, wherein each of the ridge structures comprises a continuous wire.

4. The polarizing image sensor of claim 1, further comprising a microlens array disposed adjacent to the polarizing filter, wherein the polarizing filter is positioned between the microlens array and the pixel array.

5. The polarizing image sensor of claim 1, further comprising a microlens array disposed adjacent to the polarizing filter, wherein the microlens array is positioned between the polarizing filter and the pixel array.

6. The polarizing image sensor of claim 1, further comprising a microlens array and a color filter array, wherein the polarizing filter is disposed in between the microlens array and the color filter.

7. The polarizing image sensor of claim 1, further comprising:
   a microlens array; and
   a color filter array, wherein the color filter array is positioned between the microlens array and the polarizing filter.

8. The polarizing image sensor of claim 1, wherein the polarizing filter further comprises a plurality of polarization axes of varying degrees and perpendicular to the ridge structures.

9. A method for forming a polarizing image sensor, comprising:
   forming an array of photosensitive elements in a substrate; and
   forming a plurality of metal ridge structures adjacent to the substrate to cover a bottom-half portion of the array, wherein the plurality of metal ridge structures are arranged in an arc shape that extends in a horizontal direction from a first edge of the pixel array to an opposing second edge of the pixel array and spaced substantially equidistant from one another.

10. The method of claim 9, wherein the arc shape is selected to attenuate light from various reflection angles.

11. The method of claim 10, further comprising forming a microlens array and a color filter array on at least the plurality of metal ridge structures.

12. An imaging system, comprising:
    a processing unit;
    a memory device coupled to the processing unit;
    a pixel array coupled to the processing unit and having a plurality of photosensitive elements; and
    a polarizing filter positioned adjacent to a major surface of the pixel array and overlapping only a bottom-half of the pixel array, wherein the polarizing filter comprises a plurality of metal wires, wherein each metal wire is arranged in an arc shape that extends in a horizontal direction from a first end of the pixel array to a second end of the pixel array, and wherein the plurality of metal wires are spaced substantially equidistant from one another.

13. The imaging system of claim 12, wherein the polarizing filter is disposed along a bottom portion of the pixel array.

14. The imaging system of claim 12, further comprising a microlens array disposed above the polarizing filter.

15. The imaging system of claim 12, further comprising a color filter array disposed above the polarizing filter.

16. The imaging system of claim 12, further comprising a microlens array disposed below the polarizing filter.

17. The imaging system of claim 12, further comprising a microlens array and a color filter array, wherein the polarizing filter is disposed in between the microlens array and the color filter.

18. The imaging system of claim 12, further comprising a microlens array and a color filter array, wherein the color filter array is disposed in between the microlens array and the polarizing filter.

19. The imaging system of claim 12, wherein the plurality of metal wires comprises aluminum.

20. The imaging system of claim 12, wherein the polarizing filter further comprises a plurality of polarization axes of varying degrees and perpendicular to the ridge structures.

* * * * *